(12) United States Patent
Yamazaki et al.

(10) Patent No.: US 8,284,569 B2
(45) Date of Patent: Oct. 9, 2012

(54) SHIELD CASING AND ELECTRONIC APPARATUS

(75) Inventors: Masato Yamazaki, Yokohama (JP); Michiaki Hiraoka, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 714 days.

(21) Appl. No.: 12/360,750

(22) Filed: Jan. 27, 2009

(65) Prior Publication Data

US 2009/0190321 A1    Jul. 30, 2009

(30) Foreign Application Priority Data

Jan. 29, 2008    (JP) ................................. 2008-018148

(51) Int. Cl.
    *H05K 9/00*    (2006.01)
(52) U.S. Cl. .......................... 361/818; 361/816; 174/350
(58) Field of Classification Search .................... 36/816, 36/818, 752, 679.55–58; 174/35 R, 35 GC, 174/350
    See application file for complete search history.

(56) References Cited

U.S. PATENT DOCUMENTS

| 5,233,506 | A | * | 8/1993 | Semenik et al. | ............... 361/814 |
| 5,497,296 | A | * | 3/1996 | Satou et al. | ............... 361/679.09 |
| 6,876,543 | B2 | * | 4/2005 | Mockridge et al. | ........... 455/347 |
| 6,977,822 | B2 | * | 12/2005 | Otani et al. | .................... 361/800 |
| 2002/0126466 | A1 | * | 9/2002 | Suzuki et al. | .................. 361/818 |
| 2002/0154765 | A1 | * | 10/2002 | Suzuki et al. | ............ 379/433.01 |

FOREIGN PATENT DOCUMENTS

JP    2006-351961    12/2006

* cited by examiner

*Primary Examiner* — Jinhee Lee
*Assistant Examiner* — Ingrid Wright
(74) *Attorney, Agent, or Firm* — Procopio, Cory, Hargreaves & Savitch LLP

(57) ABSTRACT

A shield casing, which is configured to surround an electronic component mounted on a circuit board, includes a frame body including an engagement recess and a lid body including a hook unit configured to engage with the engagement recess. The lid body is fitted to the frame body to cover the frame body. The hook unit is elastically deformable in a second direction that is opposite to a first direction in which the lid body is fitted to the frame body as the lid body is fitted to the frame body, and then snaps into mating engagement in the engagement recess.

21 Claims, 9 Drawing Sheets

SHIELD CASING AND ELECTRONIC APPARATUS

RELATED APPLICATION

The present application claims priority under 35 U.S.C. §119 to Japanese Patent Application No. 2008-018148, filed, Jan. 29, 2008, entitled "SHIELD CASE AND ELECTRONIC APPARATUS," which is incorporated herein by reference in its entirety.

BACKGROUND OF THE INVENTION

1. Field of the Invention

The present invention relates to a shield casing which covers an electronic component mounted on a circuit board and an electronic apparatus including the shield casing.

2. Related Art

An example of an electronic apparatus, such as a mobile phone, includes a circuit board on which electronic components are mounted and which is accommodated in a housing. The electronic components mounted on the circuit board include, for example, a high-frequency circuit component for radio communication, which is easily influenced by noise like electromagnetic waves. The electronic component which is easily influenced by noise is generally covered with a shield casing for shielding the electronic component from noise.

An example of a known shield casing is a two-piece shield casing which includes a principal-plane member and side walls which are formed separately from the principal-plane member. The side walls form a frame body, and the principal-plane member forms a lid body. The two-piece shield casing is formed by fitting the lid body to the frame body.

In a two-piece shield casing, the frame body is first fixed to a mounting surface of the circuit board, for example, such that the frame body surrounds the electronic component. The lid body is subsequently fitted to the frame body so as to fix the shield casing to the circuit board.

In the two-piece shield casing, when the lid body is fitted to the frame body, side walls of the lid body expand outward in a planar direction of the principal-plane member of the lid body, that is, in a direction substantially perpendicular to the direction in which the lid body is fitted to the frame body. Therefore, it is necessary to prevent the lid body from being separated from the frame body after the lid body is fitted to the frame body. However, plastic deformation of the side walls of the lid body easily occurs while the side walls expand outward in the planar direction of the principal-plane member.

Therefore, there has been a demand for a shield casing that does not easily cause plastic deformation.

BRIEF SUMMARY OF THE INVENTION

In one embodiment, a shield casing is designed to surround an electronic component and has a frame body including at least one engagement recess and a lid body which has at least one hook unit which engages with the engagement recess when the lid body is fitted to the frame body to cover the frame body. The hook unit is elastically deformable in a second direction when the lid body is fitted to the frame body for snap or latching engagement in the engagement recess. The second direction is opposite to a first direction in which the lid body is fitted to the frame body.

In one embodiment, the lid and frame bodies are of substantially matching, generally rectangular shape and the engagement recess and hook unit may be provided at or adjacent corresponding corners of the respective bodies. Additional engagement recesses and hook units may be provided at or adjacent some or all of the other corners. In other embodiments, the mating engagement recesses and hook units may be provided at other locations on the peripheries of the lid and frame bodies.

In a further embodiment, an electronic apparatus includes: a circuit board; an electronic component mounted on the circuit board; and the above-mentioned shield casing which is on the circuit board and surrounds the electronic component.

BRIEF DESCRIPTION OF THE DRAWINGS

The present disclosure, in accordance with one or more various embodiments, is described in detail with reference to the following Figures. The drawings are provided for purposes of illustration only and merely depict exemplary embodiments of the disclosure. These drawings are provided to facilitate the reader's understanding of the disclosure and should not be considered limiting of the breadth, scope, or applicability of the disclosure.

DESCRIPTION OF THE PREFERRED EMBODIMENTS

Certain embodiments as disclosed herein provide for a shield casing which surrounds an electronic component mounted on a circuit board. In one embodiment, the shield casing comprises a frame body which surrounds the electronic component and a lid body which is fitted to the frame body, with the frame and lid bodies having mating, interengageable latch formations which are in latching engagement when the lid body is attached to the frame body.

The following description is presented to enable a person of ordinary skill in the art to make and use the invention. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the invention.

Thus, the present invention is not intended to be limited to the examples described herein and shown, but is to be accorded the scope consistent with the claims.

Figure 1:
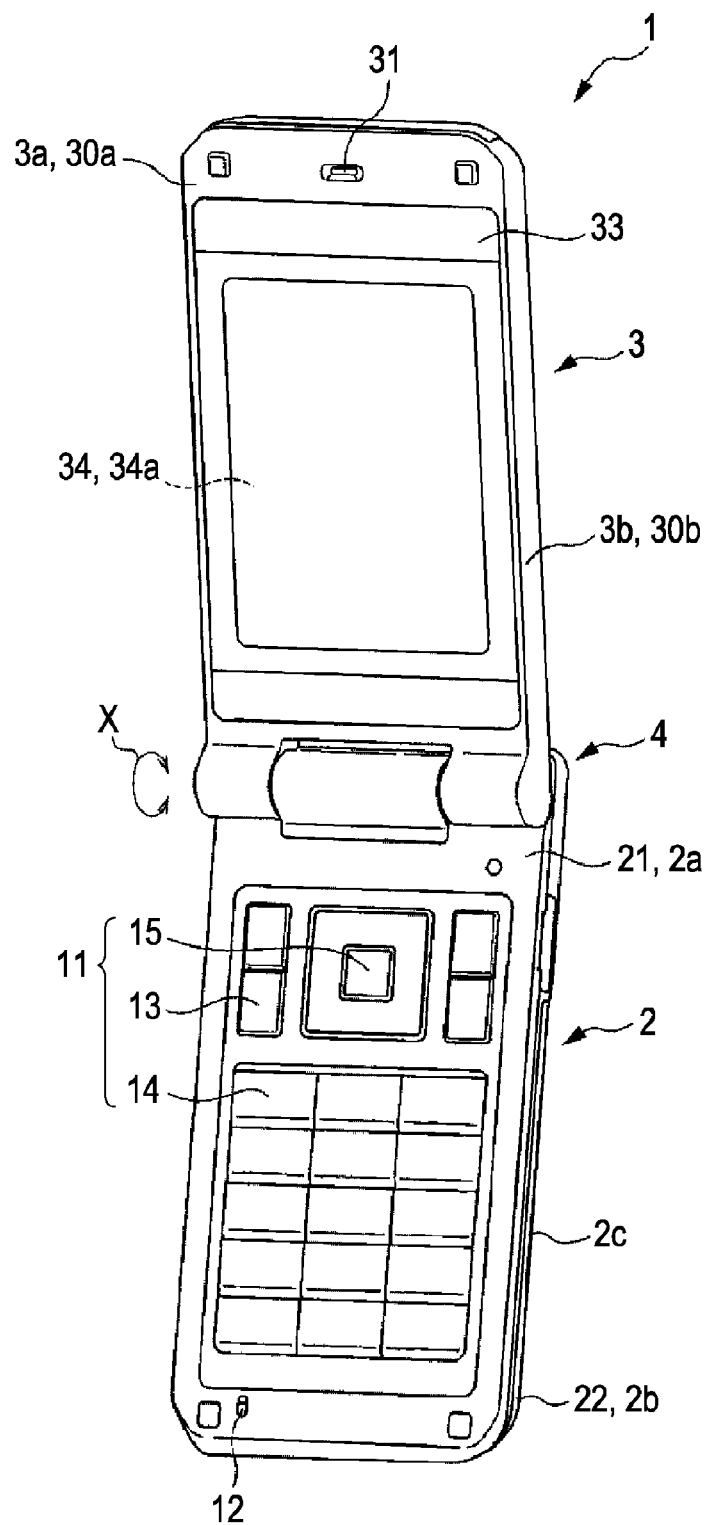
FIG. 1 is a perspective view of a mobile phone including a shield casing according to one embodiment of the invention in the state in which an operation-unit housing and a display-unit housing are in an open state.
Figure 2:
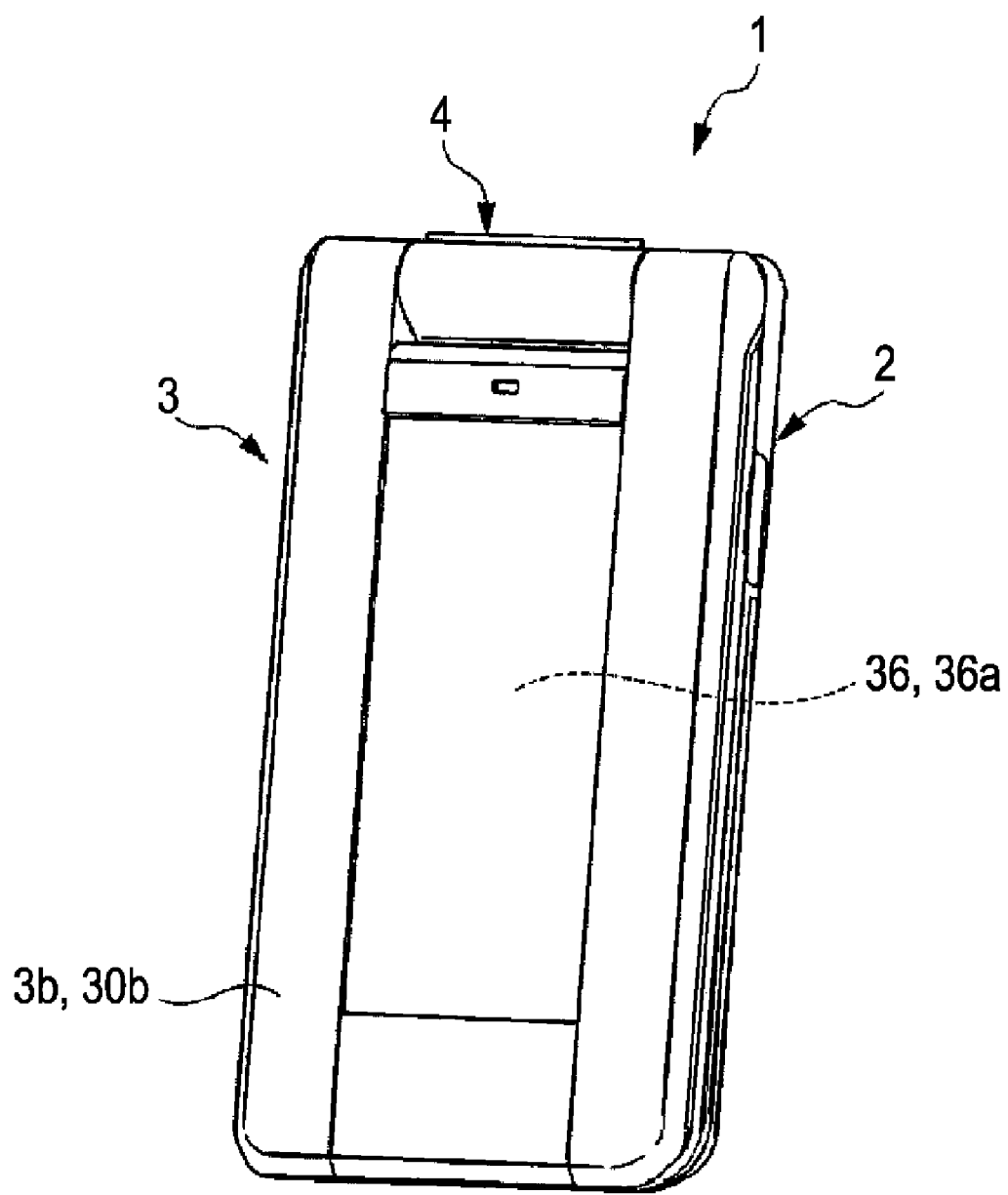
FIG. 2 is a perspective view of the mobile phone shown in FIG. 1 in a folded state, viewed from a rear side of the display-unit housing.
Figure 3:
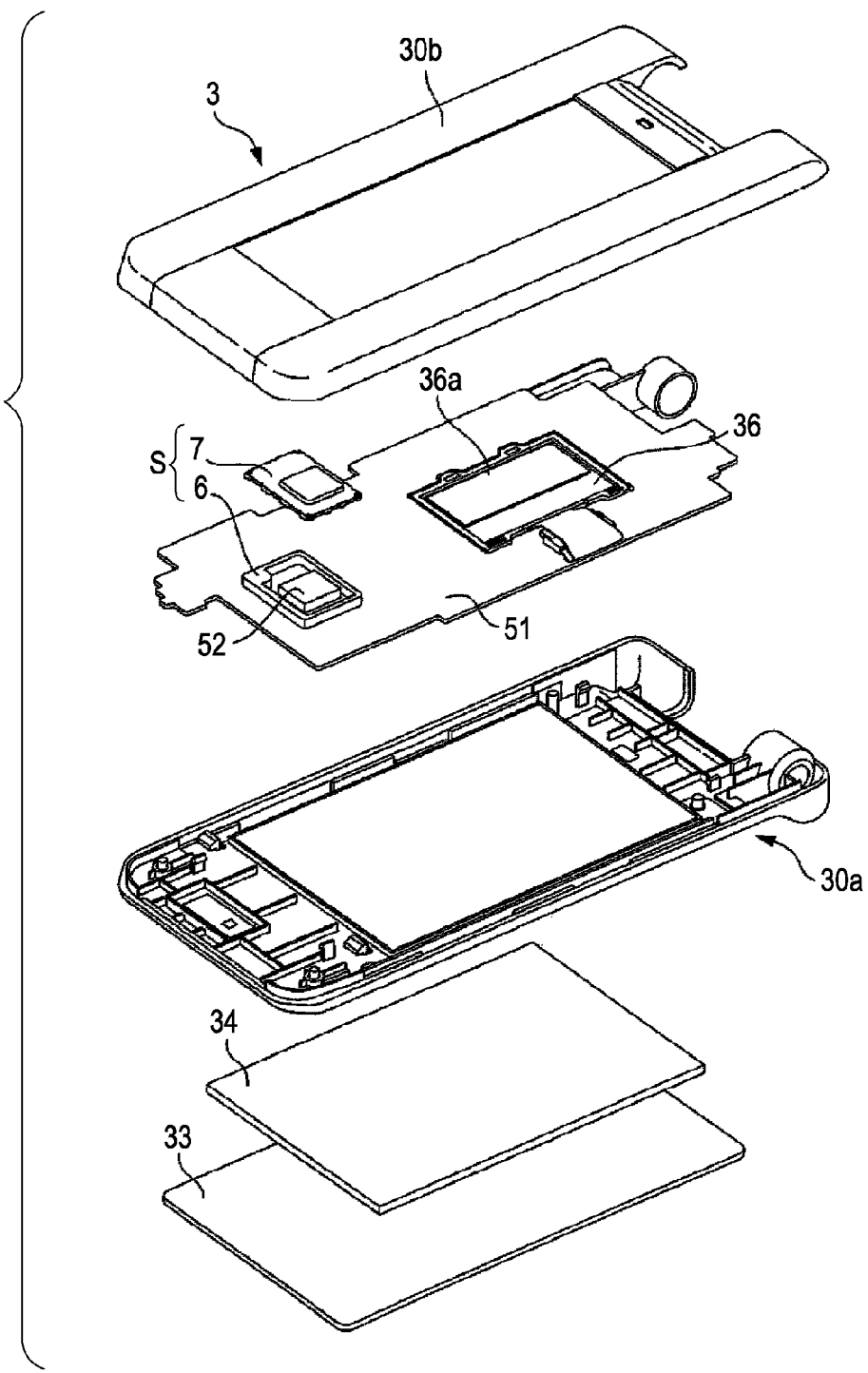
FIG. 3 is an exploded perspective view of the display-unit housing, viewed from the rear side.

Exemplary embodiments of the invention are now described with reference to the drawings. First, a basic structure of a mobile phone including a shield case S according to one embodiment is described below with reference to the FIGS. 1 to 3. FIG. 1 is a perspective view of a mobile phone including a shield casing according to one embodiment in the state in which an operation-unit housing and a display-unit housing are in an open state. FIG. 2 is a perspective view of the mobile phone shown in FIG. 1 in a folded state, viewed from a rear side of the display-unit housing. FIG. 3 is an exploded perspective view of the display-unit housing, viewed from the rear side.

As shown in FIGS. 1 to 3, a mobile phone 1 according to one embodiment is a foldable mobile phone which includes an operation-unit housing 2 having a rectangular parallelepiped shape, a display-unit housing 3 having a rectangular parallelepiped shape, and a connecting member 4 which connects the operation-unit housing 2 and the display-unit housing 3 to each other.

As shown in FIGS. 1 and 2, the outer surface of the operation-unit housing 2 is mainly defined by a front casing 21 and a rear casing 22, which function as housing members. A front surface 2a of the operation-unit housing 2 is defined by the front casing 21. The front surface 2a of the operation-unit housing 2 is a surface that faces the display-unit housing 3 when the mobile phone 1 is in the folded state. A rear surface 2b, which is a surface opposite to the front surface 2a, is defined by the rear casing 22.

The front casing 21 is arranged such that an operation key group 11 is exposed at the front surface 2a thereof. The operation key group 11 includes function-setting operation keys 13, input operation keys 14, and a decision operation key 15. The function-setting operation keys 13 are used to make various settings or to activate various functions such as an address directory function and a mail function. The input operation keys 14 include number keys for inputting, for example, phone numbers and characters for writing mails. The decision operation key 15 is used to confirm a decision in various operations or to scroll the display screen upward, downward, leftward, or rightward.

Functions which vary depending on whether the operation-unit housing 2 and the display-unit housing 3 are in the open or folded state or depending on the kind of application which is being activated are assigned to the keys included in the operation key group 11 (key assignment). In the mobile phone 1, when the user presses the keys included in the operation key group 11, functions assigned to the keys pressed by the user are executed.

A sound input unit 12 for receiving the voice of the user when the user talks on the mobile phone 1 is disposed in the front surface 2a. The sound input unit 12 is disposed at an end of the operation-unit housing 2 that is opposite to an end at which the connecting member 4 is provided in a longitudinal direction of the operation-unit housing 2. In other words, the sound input unit 12 is disposed near an end of the mobile phone 1 in a longitudinal direction thereof when the mobile phone 1 is in the open state.

An interface for transmitting and receiving data to and from an external apparatus (for example a host apparatus), headphone and microphone terminals, an interface for an attachable/detachable external memory, and a charging terminal used for charging the battery are provided on side surfaces 2c of the operation-unit housing 2.

The detailed structure of the display-unit housing 3 is now described. As shown in FIGS. 1 to 3, the outer surface of the display-unit housing 3 is mainly defined by a front casing 30a and a rear casing 30b. A front surface 3a of the display-unit housing 3 is mainly defined by the front casing 30a and a cover member 33. The front surface 3a is a surface that faces the operation-unit housing 2 when the mobile phone 1 is in the folded state. A rear surface 3b of the display-unit housing 3 is mainly defined by the rear casing 30b. The rear surface 3b is a surface opposite to the front surface 3a.

A main liquid crystal module 34 which displays various information is disposed in the display-unit housing 3. A main display unit 34a is disposed at one side of the main liquid crystal module 34 and is arranged such that the main display unit 34a is exposed at the front surface 3a of the display-unit housing 3 through an opening formed in the front casing 30a and the cover member 33, which is mainly formed of a transparent material.

A sound emitting unit 31 for emitting the voice of the person to whom the user is talking is provided on the front casing 30a. The sound emitting unit 31 is provided at an end of the display-unit housing 3 that is opposite to an end at which the connecting member 4 is provided in a longitudinal direction of the display-unit housing 3. In other words, the sound emitting unit 31 is disposed near an end of the mobile phone 1 at the display-chassis-3 side when the mobile phone 1 is in the open state.

As shown in FIGS. 2 and 3, a sub liquid crystal module 36 for displaying various information is provided on the rear casing 30b of the display-unit housing 3. A sub display unit 36a is disposed at one side of the sub liquid crystal module 36 and is arranged such that the sub display unit 36a is exposed at the rear surface 3b of the display-unit housing 3 through a transparent portion of the rear casing 30b.

The main liquid crystal module 34 and the sub liquid crystal module 36 respectively include liquid crystal panels which function as the main display unit 34a and the sub display unit 36a; driving circuits for driving the liquid crystal panels; and light source units, such as backlights, which emit light from the back of the liquid crystal panels.

An upper end portion of the operation-unit housing 2 and a lower end portion of the display-unit housing 3 are connected to each other by the connecting member 4 such that the operation-unit housing 2 and the display-unit housing 3 can be pivoted toward and away from each other. More specifically, the connecting member 4 connects the display-unit housing 3 and the operation-unit housing 2 to each other such that they can pivot toward and away from each other about a pivoting axis X. The mobile phone 1 can be set to an open state in which the operation-unit housing 2 and the display-unit housing 3 are pivoted away from each other and a folded state in which the operation-unit housing 2 and the display-unit housing 3 are stacked on each other by pivoting the operation-unit housing 2 and the display-unit housing 3, which are connected to each other by the connecting member 4, relative to each other.

The inner structure of a display-unit housing 3 is now described with reference to the FIG. 3. The display-unit housing 3 includes a rear case 30b, a sub liquid crystal module 36, a circuit board 51, a front casing 30a, a main liquid crystal module 34, and a cover member 33. In the display-unit housing 3, the rear casing 30b, the sub liquid crystal module 36, the circuit board 51, the front casing 30a, the main liquid crystal module 34, and the cover member 33 are stacked in that order.

The front casing 30a and the rear casing 30b are disposed such that recessed inner surfaces thereof face each other. The sub liquid crystal module 36 is disposed between the rear casing 30b and the front casing 30a such that a sub display unit 36a is exposed at the rear casing 30b. The circuit board 51 is disposed so as to surround the sub liquid crystal module 36.

The front casing 30a is disposed on the circuit board 51 at a side opposite to the side at which the sub liquid crystal module 36 is provided. In other words, the sub liquid crystal module 36 and the circuit board 51 are disposed between the rear casing 30b and the front casing 30a.

The circuit board 51 supplies electricity to the main liquid crystal module 34 and the sub liquid crystal module 36. Various electronic components are placed or mounted on the circuit board 51. The electronic components mounted on the circuit board 51 may include an electronic component covered with a shield casing for shielding the electronic component from noise. An example of such an electronic component is a high-frequency circuit component for radio communication. In the following description of one embodiment of a shield casing S, an electronic component shielded by the shield casing S is referred to as an "electronic component 52."

Figure 4:
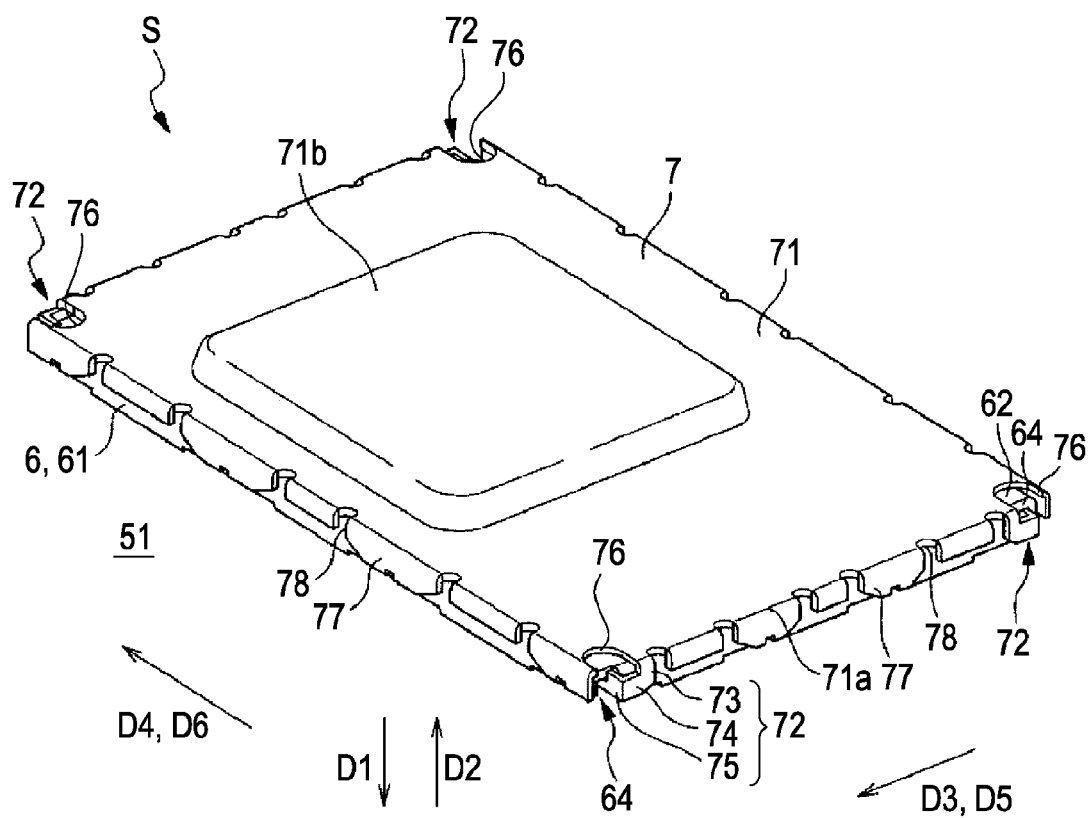
FIG. 4 is a perspective view of the shield casing according to one embodiment of the invention.
Figure 5:
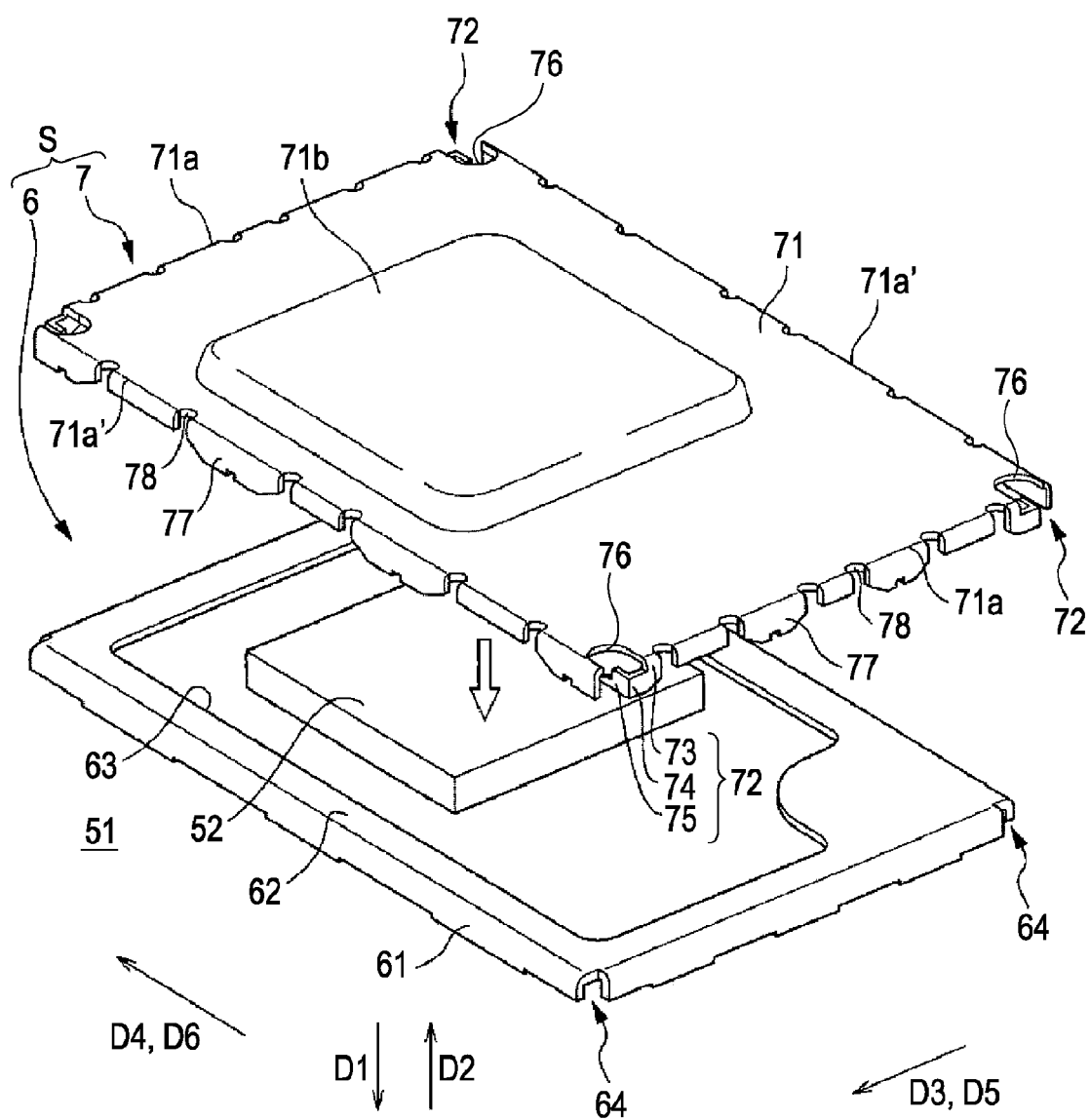
FIG. 5 is an exploded perspective view of the shield casing shown in FIG. 4.
Figure 6:
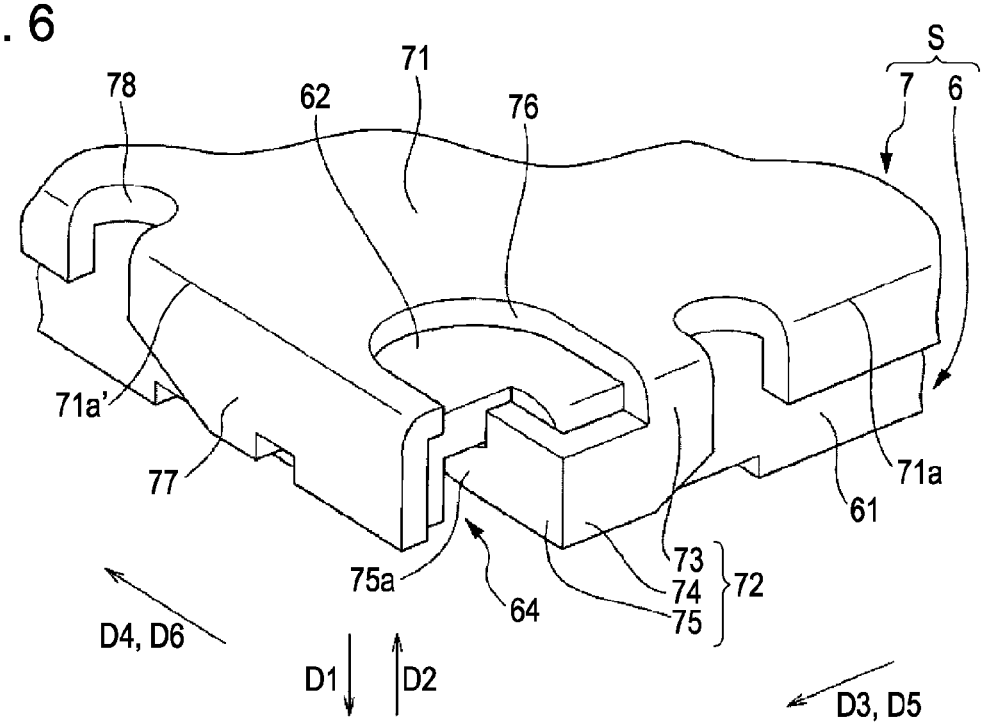
FIG. 6 is an enlarged partial view of FIG. 4.
Figure 7:
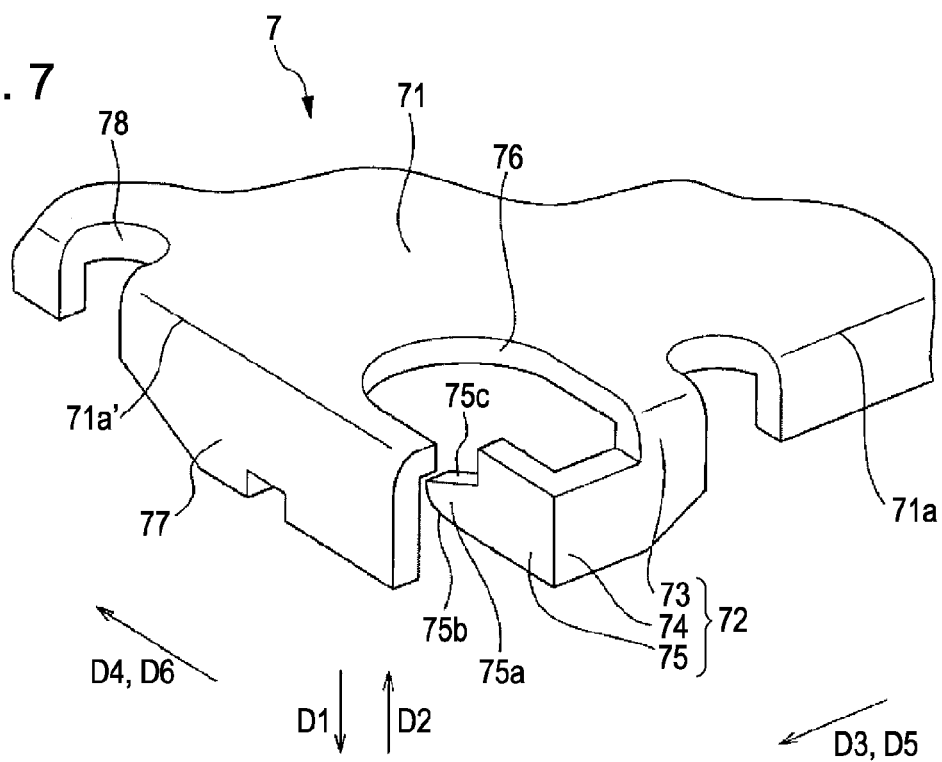
FIG. 7 is an enlarged partial view of a lid body included in the shield casing.
Figure 8:
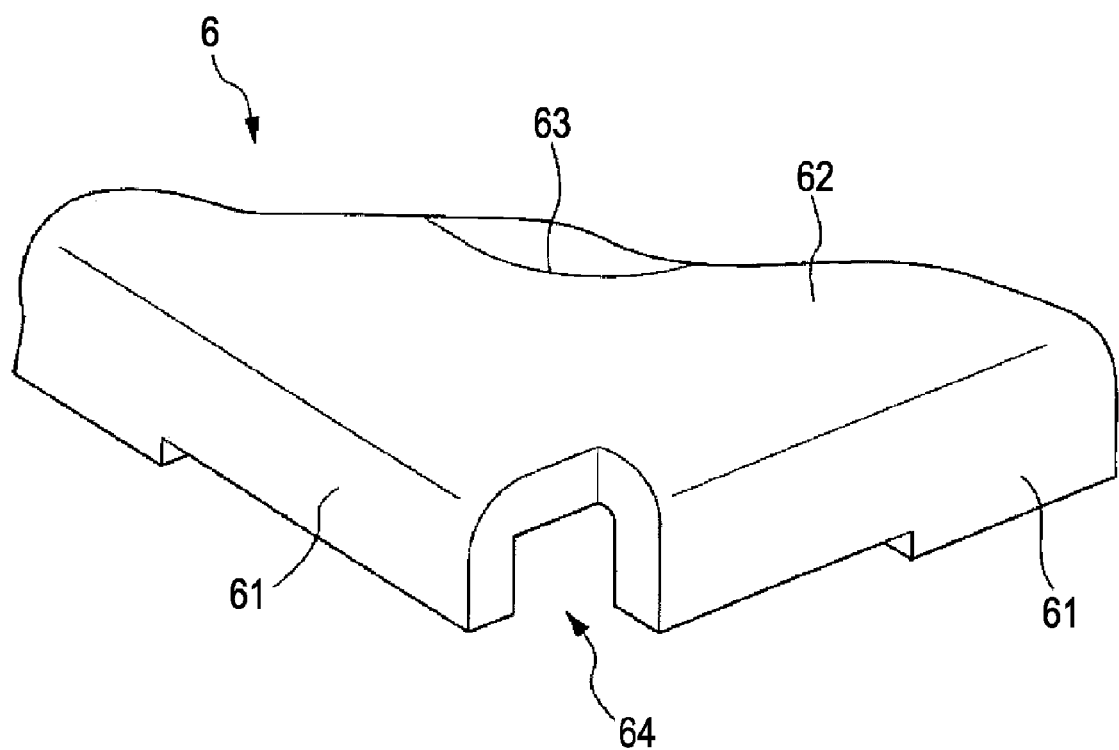
FIG. 8 is an enlarged partial view of a frame body included in the shield casing.
Figure 9A:
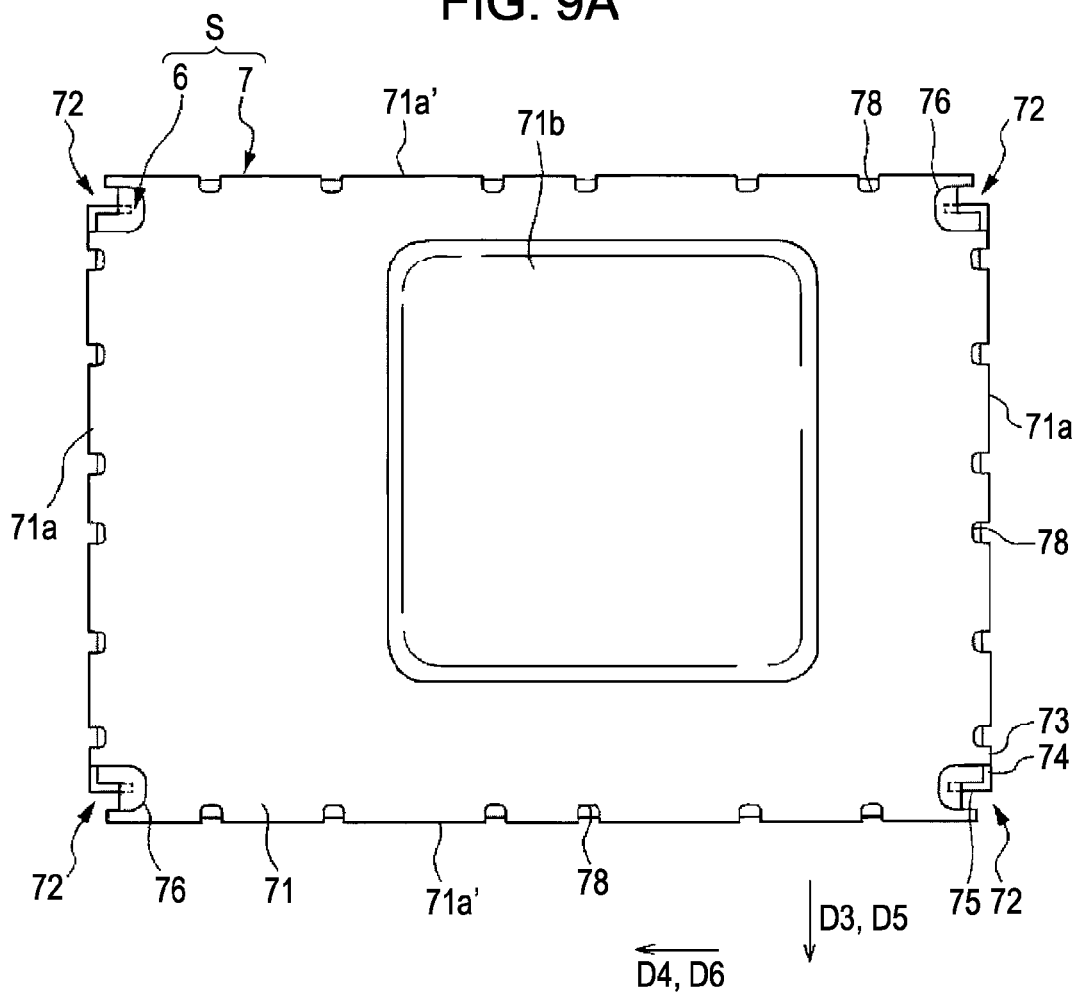
FIG. 9A is a plan view of the shield casing.
Figure 9B:
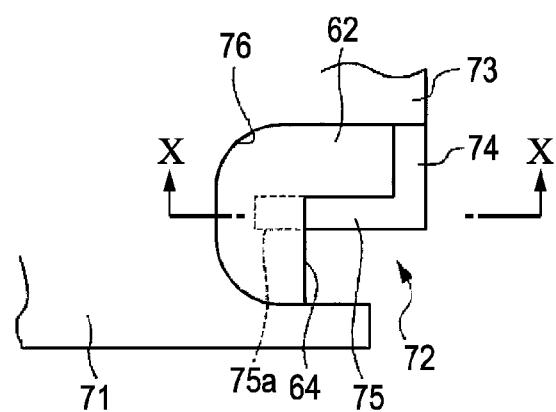
FIG. 9B is an enlarged partial view of FIG. 9A.

An exemplary embodiment of the shield case S is now described with reference to the FIGS. 4 to 10. FIG. 4 is a perspective view of the shield casing according to one embodiment. FIG. 5 is an exploded perspective view of the shield casing shown in FIG. 4. FIG. 6 is an enlarged partial view of FIG. 4. FIG. 7 is an enlarged partial view of a lid body included in the shield casing. FIG. 8 is an enlarged partial view of a frame body included in the shield casing. FIG. 9A is a plan view of the shield casing. FIG. 9B is an enlarged partial view of FIG. 9A.

Figure 10A:
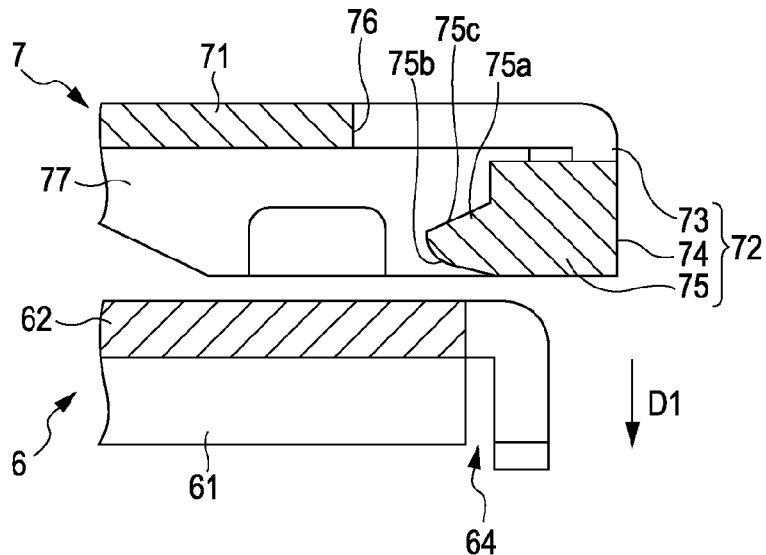
FIG. 10A is a diagram illustrating the state in which the lid body is not in contact with the frame body.
Figure 10B:
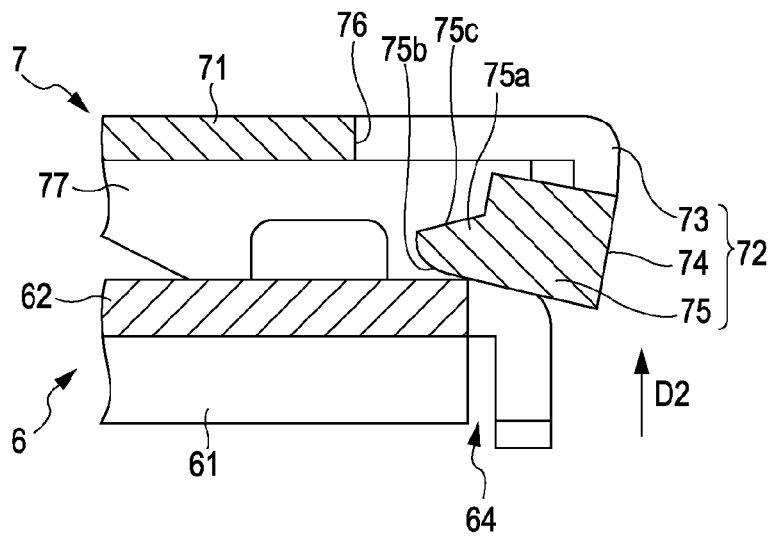
FIG. 10B is a diagram illustrating the state in which a hook unit of the lid body is pressed by the frame body and the hook unit is elastically deformed (bent)
Figure 10C:
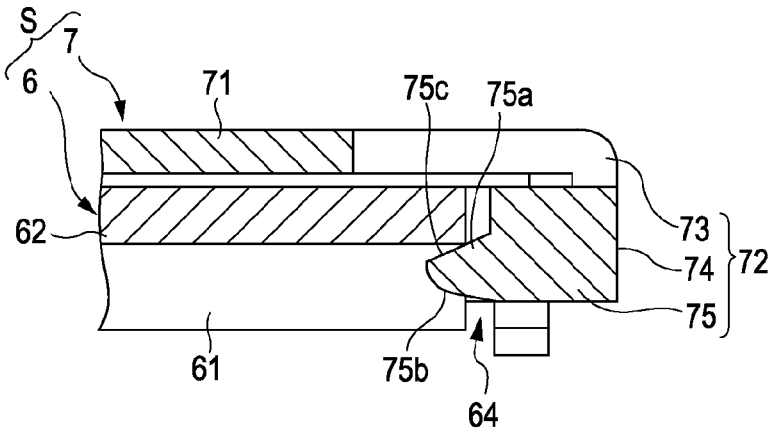
FIG. 10C is a diagram illustrating the state in which the lid body is fitted to the frame body.

FIGS. 10A to 10C are sectional views illustrating the movement of each hook unit 72 in the process of fitting the lid body 7 to the frame body 6.

The shield casing S according to one embodiment includes a frame body 6 which surrounds the electronic component 52 mounted on the circuit board 51 and a lid body 7 which is fitted to the frame body 6 so as to cover the electronic component 52. In the description regarding the shield casing S according to one embodiment of the invention, a direction in which the lid body 7 is fitted to the frame body 6 is referred to as a first direction D1, and a direction opposite to the first direction D1 is referred to as a second direction D2.

As illustrated in FIGS. 4 to 8, the frame body 6 includes a peripheral frame having side walls 61, a top-face peripheral section 62 surrounding a top-face opening 63, and engagement recesses 64. The side walls 61 form a substantially rectangular frame-shaped wall unit when the frame body 6 is viewed in the first direction D1, and are fixed to a surface (mounting surface) of the circuit board 51 on which the electronic component 52 is mounted. The size of the side walls 61 corresponds to the size of a part of the circuit board 51. The height of the side walls 61 is less than the height of the electronic component 52.

The top-face peripheral section 62 is substantially rectangular frame shaped when the frame body 6 is viewed in the first direction D1, and is connected to the top edges (edges at the ends in the second direction D2) of the side walls 61. The inner edges of the top-face peripheral section 62 form the top-face opening 63, which is substantially rectangular when the frame body 6 is viewed in the first direction D1. Thus, the frame body 6 is substantially rectangular frame shaped in a macroscopic view.

Four engagement recesses 64 in total are provided at four corners of the substantially rectangular frame-shaped frame body 6. The engagement recesses 64 are formed by partially cutting the side walls 61, more specifically, by cutting portions of the side walls 61 which correspond to the four corners.

The electronic component 52 is exposed through opening 63 when the lid body 7 is not fitted to the frame body 6. As described below, in the state in which the lid body 7 is fitted to the frame body 6, a raised portion 71b of a cover member 71 of the lid body 7 is positioned above the electronic component 52 (i.e., at the side of the electronic component 52 in the second direction D2). Therefore, the electronic component 52 does not come into contact with the lid body 7.

FIGS. 4 to 8 illustrate one example of a lid body. The lid body 7 includes a principle-plane member or cover member 71 and hook units 72 which depend from the peripheral edges of the cover member and engage with the engagement recesses 64 when the lid body 7 is fitted to the frame body 6. The cover member 71 is a substantially rectangular plate-like member as viewed in the first direction D1. In one embodiment, the cover member is planar or substantially planar in the area surrounding raised portion 71b, defining a principle plane of the cover member. The raised portion 71b is raised above the plane of the surrounding area of the cover member in second direction D2, and may be formed anywhere in the cover member depending on the location of the electronic component 52. In one embodiment, raised portion 71b is substantially at the center of the cover member 71. When the lid body 7 is fitted to the frame body 6, the raised portion 71b is disposed at a position corresponding to the electronic component 52 on the circuit board 51, and reduces the risk of the electronic component 52 coming into contact with the lid body 7.

Referring to FIGS. 6 and 7, which illustrate exemplary hook units, each of the hook units 72 includes a first extending portion 73, a second extending portion 74, and a latch claw 75. In one embodiment, the first extending portion 73 of each hook unit extends from the peripheral edge of cover member 71 of the lid body 7 in the first direction D1. In the example shown in the figures, the first extending portion 73 of each hook unit 72 extends in the first direction D1 from a side edge 71a of the cover member 71 at a position adjacent to a corresponding cut section 76, which is described below.

In addition, in each hook unit 72, the second extending portion 74 extends from the first extending portion 73 in a third direction D3, which is a direction parallel to the principle plane of cover member 71. The principle plane or "planar direction" of the cover member is the plane in which the cover member 71 expands in a macroscopic view, and is generally a direction in which the mounting surface of the circuit board 51 expands when the shield casing S is mounted on the circuit board 51. Therefore, the "planar direction" of the cover member 71 is not limited to a single direction as long as the cover member 71 expands in that direction. In one embodiment, the third direction D3 is a direction along side edges 71a of the cover member 71. The direction along the side edges 71a of the cover member 71 is also referred to as a fifth direction D5. In one embodiment, the second extending portion 74 extends from a position adjacent to a distal end of the first extending portion 73 toward a corner of the cover member 71 along the corresponding side edge 71a of the cover member 71.

In each hook unit 72, the latch claw 75 extends from the second extending portion 74 in a fourth direction D4, which differs from the third direction D3 and which is a direction toward the inside of the casing and parallel to the planar direction of the cover member 71. The fourth direction D4 and thus the latch claw 75 both point toward the frame body 6 from the second extending portion 74 as the lid body 7 is fitted to the frame body 6. Since the latch claw 75 extends toward the inside of the casing along the planar direction of the cover member 71, the latch claw 75 can be secured to the corresponding engagement recess 64.

In one embodiment of the invention, the fourth direction D4 is perpendicular to the first direction D1 in which the first extending portion 73 extends and the third direction D3 (fifth direction D5) along which the second extending portion 74 extends in each hook unit 72. The fourth direction D4 is a direction along side edges 71a' of the cover member 71, which are perpendicular to the side edges 71a from which the first extending portions 73 of the hook units 72 extend. The direction along the side edges 71a' of the cover member 71 is also referred to as a sixth direction D6. In each hook unit 72, the latch claw 75 extends from an end of the second extending portion 74 along the fourth direction D4 (sixth direction D6).

As shown in FIGS. 4, 5 and 9, four hook units 72 in total are provided at the ends of the pair of side edges 71a which face each other. The other pair of side edges 71a', which are perpendicular to the side edges 71a, are free from the hook units 72.

As shown in FIGS. 7 and 10, in each hook unit 72, a distal end portion 75a of the latch claw 75 has a bottom end face (end face) 75b at the side opposite to the principal-plane or cover member 71, and the bottom end face 75b is shaped such that the distance from the cover member 71 gradually decreases as the distance from the second extending portion 74 increases. In one embodiment, the bottom end face 75b of the distal end portion 75a of latch claw 75 is smoothly curved. The distal end portion 75a of the latch claw 75 also has a top end face 75c opposite to the bottom end face 75b, and the top end face 75c is shaped such that the distance from the cover member 71 gradually increases as the distance from the second extending portion 74 increases. The top end face 75c of the distal end portion 75a of the latch claw 75 may be tapered to extend linearly at an angle to the cover member 71.

As shown in FIGS. 5 and 9, the lid body has side walls extending from the four side edges 71a and 71a' of the cover member 71 in the first direction D1. The side walls each have a plurality of spaced recesses 78 between adjacent side wall portions 77. In one embodiment, the side walls with recesses 78 are formed in generally rectangular sheet of material by cutting the material at spaced intervals along the peripheral edges of the sheet to form the recesses 78 between adjacent portions 77. The recesses 78 are provided to facilitate the process of bending the material of the lid body 7 along the lines corresponding to the side edges 71a and 71a' to form the side walls.

As shown in FIGS. 6 and 10C, the hook units 72 are engaged with the respective engagement recesses 64 in the frame body 6. More specifically, in one embodiment, the latch claws 75 or the distal end portions 75a of the latch claws 75 are secured to the respective engagement recesses 64 in the frame body 6, so that the hook units 72 are engaged with the respective engagement recesses 64.

The frame body 6 and the lid body 7 are formed of a single sheet metal. In other words, the frame body 6 and the lid body 7 are formed of a metal plate by sheet-metal processing.

The hook units 72 are substantially elastically deformable in the second direction D2 when the hook units 72 are pressed by the frame body 6 in the process of fitting the lid body 7 to the frame body 6. When the hook units 72 are pressed in the second direction D2 in the process of fitting the lid body 7 to the frame body 6, the second extending portions 74 can be bent in the second direction D2. The elastic deformation of the hook units 72 (bending of the second extending portions 74) in the process of fitting the lid body 7 to the frame body 6 is described in detail below together with the description of movement of the hook units 72 in the process of fitting the lid body 7 to the frame body 6.

As shown in FIG. 7, cut sections 76 are formed at the four corners of the substantially rectangular plate-shaped cover member 71. The cut sections 76 are formed in areas where the latch claws 75 are positioned when the principal-plane member 71 is viewed in the first direction D1, and allow for the elastic deformation of the second extending portions 74 and latch claws 75.

FIGS. 10A to 10C illustrate the fitting or attachment of the lid body 7 to the frame body 6 to form the shield casing S having the above-described structure. FIGS. 10A to 10C are sectional views illustrating the movement of each hook unit 72 in the process of fitting the lid body 7 to the frame body 6. In FIG. 10A, the lid body 7 is positioned over the frame body 6 prior to attachment to the frame body. FIG. 10B shows a subsequent stage in which a hook unit of the lid body engages a portion of the frame body and is elastically deformed (bent) as the lid body continues to be pressed down into engagement with the frame body. FIG. 10C is a diagram illustrating the lid body fitted to the frame body with the latch claw extending into the engagement recess 64.

When the lid body 7 is moved in the first direction D1 toward the frame body 6, as shown in FIGS. 10A and 10B, the distal end portion 75a of the latch claw 75 of each hook unit comes into contact with the top-face peripheral section 62 at a position near the corresponding engagement recess 64 in the frame body 6, and is pressed or deformed upwardly in second direction D2. As a result, the second extending portion 74 of the hook unit 72 is bent in the second direction D2 and the hook unit 72 of the lid body 7 is substantially elastically deformed.

The state in which "the second extending portion 74 is bent" includes various cases in which the second extending portion 74 is bent in different manners. The manners in which the second extending portion 74 is bent includes a manner in which, for example, the second extending portion 74 itself is barely deformed but a section around a proximal end portion of the first extending portion 73 (portion at the corresponding edge 71a of the cover member 71) is bent so that the inclination and position of the second extending portion 74 are changed (first manner, which is shown in FIGS. 10A to 10C). In addition, the manners in which the second extending portion 74 is bent also includes a manner in which the second extending portion 74 itself is deflected or twisted so that the inclination and position of the second extending portion 74 are changed (second manner) and a third manner, which is a combination of the first manner and the second manner.

When the lid body 7 is moved further toward the frame body 6 in the first direction D1 from the state shown in FIG. 10B, the second extending portion 74 is bent in the second direction D2 sufficiently to allow the distal end portion 75a of the latch claw 75 to clear the edge of the frame body and enter the corresponding engagement recess 64, as shown in FIG. 10C. Thus, the latch claw 75 is snapped into mating engagement with engagement recess 64. As noted above, the bottom end face 75b of the distal end portion 75a is shaped such that the distance from the cover member 71 gradually decreases as the distance from the second extending portion 74 increases. Therefore, the bottom end face 75b of the distal end portion 75a smoothly slides along the top edge of the top-face peripheral section 62 (edge near the cover member 71 in FIG. 10B) at a position adjacent to the engagement recess 64, and easily passes over the top edge of the top-face peripheral section 62.

Finally, as shown in FIG. 10C, the distal end portion 75a of the latch claw snaps back from its deformed state into engagement with the engagement recess, with the top end face 75*c* of the distal end portion 75*a* of the latch claw 75 contacting the bottom edge of the top-face peripheral section 62 at a position adjacent to the engagement recess 64. Thus, the latch claw 75 is secured to the engagement recess 64. Since the hook unit 72 is substantially elastically deformable, the hook unit 72 returns to the original state (original inclination and position) after the latch claw slides over the outer edge of peripheral section 62. Thus, the lid body 7 is secured to the frame body 6.

In the case where the hook units 72 are formed of a metal plate, if the hook units 72 are bent, deflected, or twisted, there may be a case in which some plastic deformation is unavoidable. Even if the hook units 72 cause some plastic deformation, the effects described below may still be obtained. Thus, the structure in which "the hook units 72 are elastically deformable" does not exclude the case in which some plastic deformation occurs without preventing the latch claws from engaging in the corresponding engagement recesses. Even when the second extending portions 74 cause some plastic deformation, the second extending portions 74 tilt inward along the planar direction of the cover member 71, and therefore the possibility that the fitting force between the frame body 6 and the lid body 7 is considerably reduced is small.

Therefore, the lid body 7 is secured to the frame body 6 relatively reliably and the risk of a reduced shielding effect of the shield casing S is reduced. In addition, the shielding performance of the shield casing S after a refitting process may be increased.

The present invention is not limited to the above-described embodiment, and various modifications are possible. For example, in the shield casing S according to the present embodiment, the size of the frame body 6 corresponds to the size of a part of the circuit board 51. However, the present invention is not limited to this, and the frame body 6 may have a size corresponding to the size of the entire body of the circuit board 51. In other words, the shield casing S may be formed so as to cover the entire body of the circuit board 51.

It is not necessary that the cut sections 76 be formed in the lid body 7. Even if the cut sections 76 are not formed, the hook units 72 can be caused to engage with the respective engagement recesses 64 in the process of fitting the lid body 7 to the frame body 6 by adequately setting the shape and size of the hook units 72 and the shape, size, and configuration of the engagement recesses 64.

In the present embodiment, four hook units and four engagement recesses are formed. However, the present invention is not limited to this. For example, two hook units and two engagement recesses may be formed at two diagonal corners of the shield casing. The hook units and engagement recesses may also be located elsewhere on the side edges of the lid body and frame body in other embodiments. In other embodiments, the hook units and engagement recesses of the embodiments described above may be replaced with other mateable latching formations.

The first direction D1 may be somewhat inclined toward the inside along the planar direction of the cover member 71 of the lid body 7, that is, toward the frame body 6. The third direction D3 may be inclined with respect to the fifth direction D5, which is a direction along the edges 71*a* of the cover member 71. The shield casing is not limited to a shield casing provided on the display-unit housing 3, and the shield casing may also be applied to a shield casing provided on the operation-unit housing 2.

The shield casing may be included in a portable electronic apparatus other than a mobile phone in other embodiments, and may also be applied to a shield casing included in an electronic apparatus other than a portable electronic apparatus. Further, the shield casing may be used for an apparatus other than an electronic apparatus.

In addition, in the above-described embodiment, the connecting member 4 connects the display-unit housing 3 and the operation-unit housing 2 to each other such that they can pivot toward and away from each other about the pivoting axis X. However, the connecting member 4 may also have a two-axis hinge mechanism with which the display-unit housing 3 and the operation-unit housing 2 are connected to each other such that they can not only pivot toward and away from each other about the pivoting axis X but also can rotate relative to each other about a rotation axis perpendicular to the pivoting axis X.

In addition, it is not necessary that the portable electronic apparatus comprising a shield case be a foldable type. For example, the portable electronic apparatus may also be a slidable type in which one of the operation-unit housing 2 and the display-unit housing 3 can be slid relative to the other one in a certain direction from the state in which the operation-unit housing 2 and the display-unit housing 3 are stacked on each other. Alternatively, the portable electronic apparatus may be of a rotational type (revolver type) in which one of the operation-unit housing 2 and the display-unit housing 3 can be rotated relative to the other one about a line which extends in a direction in which the operation-unit housing 2 and the display-unit housing 3 are stacked on each other.

Although exemplary embodiments of the present invention have been described above with reference to the accompanying drawings, it is understood that the present invention is not limited to the above-described embodiments. Various alterations and modifications to the above embodiments are contemplated to be within the scope of the invention. It should be understood that those alterations and modifications are included in the technical scope of the present invention as defined by the appended claims.

Terms and phrases used in this document, and variations hereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

The invention claimed is:

1. A shield casing configured to surround an electronic component mounted on a circuit board, the shield casing comprising:
   a frame body having at least one engagement recess; and
   a lid body having a hook unit configured to engage with the engagement recess, the lid body being fitted to the frame body and covering the frame body with the hook unit engaged in the engagement recess;
   wherein at least part of the hook unit is elastically deformable in a second direction when the lid body is fitted to the frame body, the second direction being opposite to a first direction in which the lid body is fitted to the frame body,
   the lid body has a cover member which extends over the frame body and includes a cut section, and the hook unit has a first portion extending from the cover member generally in the first direction, a second portion extending from the first portion in a direction perpendicular to the first direction, and a latch claw extending from the second portion inwardly, in a direction perpendicular to the direction of the second portion, and the latch claw extending along the cut section and including an inclined end portion.

2. The shield casing according to claim 1, wherein the cover member defines a plane which is at least substantially planar and the second portion and latch claw both extend substantially parallel to the plane of the cover member portion.

3. The shield casing according to claim 1, wherein the cover member defines a plane, wherein the hook unit includes a first extending portion which extends in the first direction from the cover member, a second extending portion which extends from the first extending portion in a third direction, and the latch claw extends from the second extending portion in a fourth direction towards the inside of the casing and is capable of being secured to the engagement recess, the third and fourth directions being parallel to the plane.

4. The shield casing according to claim 3, wherein the second extending portion is elastically deformable in the second direction when the lid body is fitted to the frame body.

5. The shield casing according to claim 3, wherein an end face of a distal end portion of the latch claw at a side opposite to the cover member is curved towards the cover member.

6. The shield casing according to claim 3, wherein cover member has peripheral side edges, the first extending portion extends from a side edge of the cover member, and wherein the third direction coincides with a fifth direction, the fifth direction being a direction along the side edge of the cover member.

7. The shield casing according to claim 1, wherein the cut section is in an area corresponding to the latch claw when the lid body is viewed in the first direction.

8. The shield casing according to claim 1, wherein the lid body is formed of a single sheet of material.

9. The shield casing according to claim 1, wherein the frame body has a plurality of engagement recesses and the lid body has a corresponding number of hook units which engage in the respective recesses when the lid body is fitted to the frame body.

10. The shield casing according to claim 9, wherein the frame body is generally rectangular and the lid body comprises a cover member of rectangular shape and dimensions designed to engage over the frame body, the frame body and cover member having peripheral side edges, end edges, and corner regions, and the engagement recesses and hook units being located in at least two corner regions of the frame body and cover member, respectively.

11. The shield casing according to claim 10, wherein the frame body has four engagement recesses at the respective corner regions of the frame body and the cover member has four corresponding hook units at respective corner regions of the cover member.

12. The shield casing according to claim 1, wherein the inclined end portion of the latch claw includes an inclined bottom end face.

13. The shield casing according to claim 1, wherein the inclined end portion of the latch claw includes an inclined top end face.

14. The shield casing according to claim 1, wherein the cover member includes a corner portion with the cut section.

15. The shield casing according to claim 1, wherein the second portion and the latch claw form a L shape.

16. An electronic apparatus, comprising:
   a circuit board;
   an electronic component mounted on the circuit board; and
   a shield casing on the circuit board, surrounding the electronic component;
      the shield casing comprising a frame body extending around electronic component, the frame body having at least one engagement recess, and a lid body fitted to the frame body to cover the electronic component, the lid body comprising a cover member facing the electronic component and at least one hook unit depending from the cover member and in latching engagement with the engagement recess, at least part of the hook unit being elastically deformable as the lid body is attached to the frame body,
   the cover member including a cut section and the hook unit including a first portion extending from the cover member generally in a first direction, a second portion extending from the first portion in a direction perpendicular to the first direction, and a latch claw extending from the second portion inwardly, in a direction perpendicular to the direction of the second portion, and the latch claw extending along the cut section and including an inclined end portion.

17. The electronic apparatus according to claim 16, wherein the electronic component is a high-frequency circuit component for radio communication, and wherein the shield casing shields the high-frequency circuit component.

18. The electronic apparatus according to claim 16, wherein the inclined end portion of the latch claw includes an inclined bottom end face.

19. The electronic apparatus according to claim 16, wherein the inclined end portion of the latch claw includes an inclined top end face.

20. The shield casing according to claim 16, wherein the cover member includes a corner portion with the cut section.

21. The shield casing according to claim 16, wherein the second portion and the latch claw form a L shape.

* * * * *